United States Patent
Coyne

(10) Patent No.: US 12,349,428 B2
(45) Date of Patent: Jul. 1, 2025

(54) LOW GATE CURRENT JUNCTION FIELD EFFECT TRANSISTOR DEVICE ARCHITECTURE

(71) Applicant: Analog Devices International Unlimited Company, County Limerick (IE)

(72) Inventor: Edward John Coyne, Athenry (IE)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 18/510,238

(22) Filed: Nov. 15, 2023

(65) Prior Publication Data

US 2024/0088229 A1 Mar. 14, 2024

Related U.S. Application Data

(63) Continuation of application No. 15/798,182, filed on Oct. 30, 2017, now abandoned.

(51) Int. Cl.
*H10D 62/17* (2025.01)
*H10D 30/01* (2025.01)
(Continued)

(52) U.S. Cl.
CPC ....... *H10D 62/371* (2025.01); *H10D 30/0512* (2025.01); *H10D 30/83* (2025.01);
(Continued)

(58) Field of Classification Search
CPC ............. H01L 29/1058; H01L 29/1066; H01L 29/808; H01L 29/8086; H01L 29/66893–66091; H01L 29/1083; H01L 29/0653; H01L 29/0607–0623; H01L 29/0687–0688; H01L 29/36–365; H01L 27/098; H01L 27/14679; H01L 2924/13062; H10D 62/328; H10D 62/343; H10D 62/371; H10D 62/116;
(Continued)

(56) References Cited

U.S. PATENT DOCUMENTS 4,485,392 A 11/1984 Singer
4,843,441 A 6/1989 Willard
(Continued)

FOREIGN PATENT DOCUMENTS

CN 101366123 2/2009
CN 102254951 11/2011
(Continued)

OTHER PUBLICATIONS

Office Action in Chinese Patent Application No. 201811272005.4 dated Jun. 22, 2021.
(Continued)

*Primary Examiner* — Donald H B Braswell
*Assistant Examiner* — John Lin
(74) *Attorney, Agent, or Firm* — Knobbe, Martens, Olson & Bear, LLP

(57) ABSTRACT

A JFET is provided with a very low gate current. In tests the excess gate current above the theoretical minimum current for a similarly sized reverse biased p-n junction was not observed. The JFET includes a lightly doped top gate and doped regions beneath the drain of the JFET.

18 Claims, 12 Drawing Sheets

(51) Int. Cl.
  *H10D 30/83* (2025.01)
  *H10D 62/10* (2025.01)
(52) U.S. Cl.
  CPC ......... *H10D 62/102* (2025.01); *H10D 62/116* (2025.01); *H10D 62/125* (2025.01); *H10D 62/343* (2025.01)
(58) Field of Classification Search
  CPC .. H10D 62/102; H10D 62/103; H10D 62/105; H10D 62/106; H10D 62/107; H10D 62/124; H10D 62/125; H10D 62/60; H10D 62/605; H10D 30/83; H10D 30/832; H10D 30/051; H10D 30/0512; H10D 30/0516; H10D 84/87
  See application file for complete search history.

(56) References Cited

U.S. PATENT DOCUMENTS

| | | | |
|---|---|---|---|
| 2007/0145410 A1 | 6/2007 | Wilson et al. | |
| 2007/0278568 A1* | 12/2007 | Williams | H01L 29/66106 257/E29.054 |
| 2008/0042199 A1 | 2/2008 | Trogolo et al. | |
| 2010/0019290 A1* | 1/2010 | Kapoor | H01L 29/808 257/256 |
| 2010/0032731 A1* | 2/2010 | Babcock | H01L 29/812 257/280 |
| 2010/0271079 A1* | 10/2010 | Choi | H03K 17/567 327/108 |
| 2011/0084318 A1* | 4/2011 | Gibby | H01L 29/66901 257/256 |
| 2012/0063049 A1 | 3/2012 | Modica et al. | |
| 2013/0248945 A1* | 9/2013 | Bracale | H03F 1/0266 257/262 |
| 2014/0062524 A1 | 3/2014 | Hu et al. | |
| 2014/0184275 A1 | 7/2014 | Yeh et al. | |
| 2015/0102391 A1* | 4/2015 | Coyne | H01L 29/0843 257/270 |
| 2016/0254258 A1 | 9/2016 | Tsuchiko | |

FOREIGN PATENT DOCUMENTS

| | | |
|---|---|---|
| CN | 102414984 | 4/2012 |
| CN | 104201208 | 12/2014 |
| CN | 105140303 | 12/2015 |
| EP | 2 863 418 A1 | 4/2015 |
| JP | S64 76775 A | 3/1989 |
| TW | 201010075 | 3/2010 |
| WO | WO 2014/036280 | 3/2014 |

OTHER PUBLICATIONS

Office Action in Chinese Patent Application No. 201811272005.4 dated Feb. 22, 2022.
Extended European Search Report for European Patent Application No. 18200790.6, dated Mar. 6, 2019.
Response to Extended European Search Report for European Patent Application No. 18200790.6, dated Aug. 9, 2019.
Intention to Grant for European Patent Application No. 18200790.6, dated Mar. 6, 2020.
Decision to Grant for European Patent Application No. 18200790.6, dated Jul. 30, 2020.

* cited by examiner

LOW GATE CURRENT JUNCTION FIELD EFFECT TRANSISTOR DEVICE ARCHITECTURE

RELATED APPLICATION

Any and all applications for which a foreign or domestic priority claim is identified in the Application Data Sheet as filed with the present application are hereby incorporated by reference under 37 CFR § 1.57. This application is a continuation of U.S. patent application Ser. No. 15/798,182, filed Oct. 30, 2017 and titled "LOW GATE CURRENT JUNCTION FIELD EFFECT TRANSISTOR DEVICE ARCHITECTURE," the disclosure of which is hereby incorporated by reference in its entirety herein.

FIELD OF DISCLOSURE

The present disclosure relates to an improved architecture for junction field effect transistors, JFETs, which reduces excess gate current of a JFET, such that the gate current substantially matches the reverse bias diode current that would be expected from the reverse current flow of a reverse biased p-n junction.

BACKGROUND

Broadly speaking field effect transistors, FETs, modulate the width of a "channel" region of semiconductor in order to vary the magnitude of current flowing between current flow terminals of the device. These terminals are known as a drain and a source of the FET.

The current is modulated by subjecting the channel region to an electric field which can alter the size of depletion regions with the FET. The electric field is generated by applying a voltage to a "gate" of the FET. The gate region is insulated from the channel. The way in which the isolation is achieved can be used to classify FETs.

In one class of FET, the gate is separated from the channel by a layer of dielectric material, such as silicon oxide. These devices, often described as MOSFETs, exhibit a large input impedance at low frequency.

In a second class of FET the gate is insulated from the channel by a PN junction. Although a reverse biased PN junction can exhibit a high impedance, there is inherently a small leakage gate current. Furthermore, events such as impact ionization within the FET can give rise to the creation of minority carriers that travel to the gate and give rise to an increased gate current.

Consequently, JFETs take a gate current whereas MOSFETs do not. This statement ignores current flows resulting from the need to charge or discharge capacitances associated with the gate where gate current increases as a function of increasing frequency.

There are situations where JFETs are chosen because of other characteristics they exhibit. It would therefore be advantageous to reduce the excess gate leakage current of a JFET.

SUMMARY OF THE DISCLOSURE

According to a first aspect of this disclosure there is provided a junction field effect transistor (JFET) comprising: a first doped region acting as a source region; a second doped region acting as a drain region; a bottom gate, a top gate and a channel extending between the first and second doped regions. The top gate is lightly doped. As a result, during use the top gate becomes depleted. The first and second doped regions are formed such that they touch the top gate or are spaced apart from the top gate by less than twice the depth of the top gate. At least a third doped region is formed opposite the second doped region but is separated therefrom by the channel and is doped with the same type of dopant as the second doped region. The provision of the third region helps set up an electric field that tends to draw the path of the current carriers within the channel away from the edges of the top gate.

This structure keeps regions of increased current density separated from regions of increased E-field intensity. This helps prevent impact ionization, which in turn stops excess gate current occurring.

According to a second aspect of this disclosure there is provided a method of forming a JFET having first, second and third doped regions of a first semiconductor type, the method comprising forming the third region of a first semiconductor type in or adjacent a region of a semiconductor type which in the completed JFET forms a back gate of the JFET. Then a layer of semiconductor of first semiconductor type is formed over the back gate and the third region. The layer of semiconductor is less highly doped that the third region and in the device forms the channel of the JFET. Next first and second doped regions and a top gate are formed at the top of the device, where the top gate is between the first and second regions and the second region is formed above the third region and is separated from the third region by a portion of the layer of semiconductor.

BRIEF DESCRIPTION OF THE DRAWINGS

Embodiments of the present disclosure will now be described, by way of non-limiting example only, with reference to the accompanying drawings, in which.

DETAILED DESCRIPTION

Figure 1:
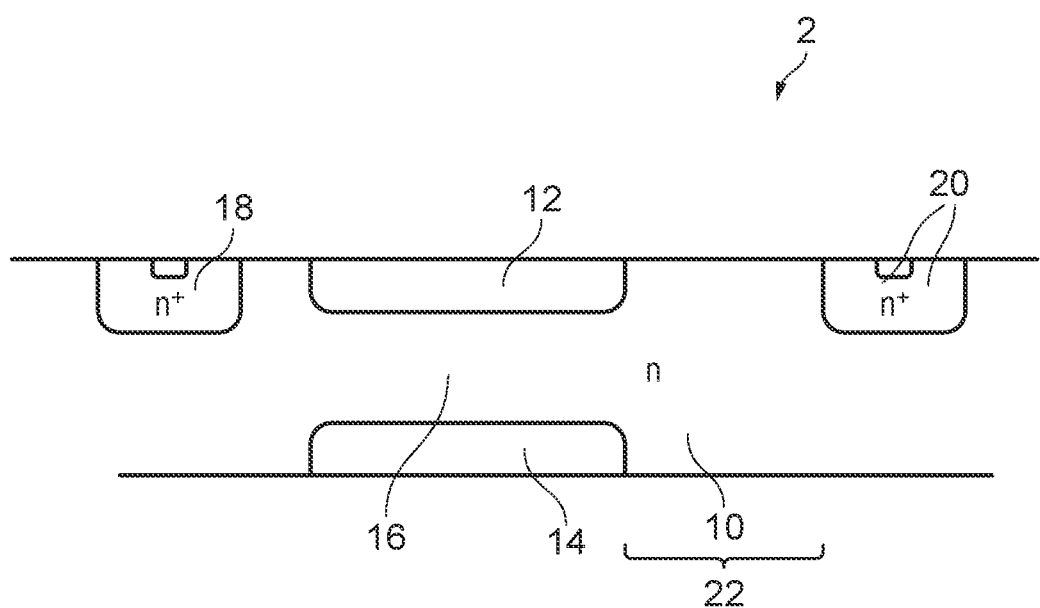
FIG. 1 is a schematic diagram of a prior art and conventional JFET.

In the Figures some of the device structures, such as regions of doped material are delimited by lines. These boundaries are representative only and it should be appreciated that the doping concentration may vary over a distance giving rise to a blurring of the transition between P type and N type regions rather that giving rise to a distinct boundary.

Terms such as "above", "below", "to the right hand side of" and the like refer to the relative placement of features in the drawings when the drawings are in an upright orientation. Such terms are not limiting of the positions of components or regions within a device in accordance with the teachings of this disclosure unless the device has been orientated so as to match the orientation of an equivalent one of the drawings.

Despite the apparent disadvantages of the JFET in terms of its ability to draw an additional gate current compared to a MOSFET as set out above, it still remains in use because the JFET can offer better noise performance. Typically current flow in a MOSFET occurs near a surface of the device. The structure of the semiconductor lattice can be more disrupted at the surface of the device. For example changes in interatomic distances and/or unit cell structure between the semiconductor and an overlying oxide layer may stress and distort the semiconductor lattice. Also damage is caused to the semiconductor lattice by the ion implantation step to dope the channel of the MOSFET. By contrast the current flow path in a JFET occurs further away from the surface of the device in the channel region and the lattice is less disrupted away from the surface.

A further feature of a transistor is the maximum voltage that can be applied across the device before it breaks down and conducts uncontrollably. Breakdown is typically caused by electric field intensity being strong enough to rip electrons away from atoms within the semiconductor, and then accelerate them such that as they interact with other atoms. The fast moving electrons cause further electrons to be stripped away from the other atoms and accelerated, and so on. This is known as avalanche breakdown.

The breakdown voltage of a FET is typically controlled by varying the distance between the drain and the gate. Increasing the distance means that for a given gate to drain voltage the field as expressed in volts per meter gets reduced. This additional distance, which will be referred to as an extended channel region, increases the breakdown voltage but also increases the resistance of the channel.

The increased resistance gives rise to an increased device noise, lower maximum current, increased internal heating and a reduced maximum operating frequency by virtue of carriers taking longer to transit between the source and drain.

The above parameters are just examples of some of the parameters of a field effect transistor, and it can be seen that improving one aspect of device performance can degrade another aspect of device performance.

A simplified schematic of a JFET 2 is shown in FIG. 1. The JFET comprises a body 10 of semiconductor of a first type. Here the first type semiconductor is doped to be n-type. The body 10 is doped to a first doping concentration, for example between $10^{16}$ and $10^{17}$ donors per $cm^3$ and is designated "n". First and second gate regions 12 and 14 of a second type of semiconductor, in this example p type, are formed at the top and bottom of the body 10. The gate regions 12 and 14 are of limited spatial extent and serve to form a channel of reduced height (although it is often called width) in the material 10. Given the orientation shown in FIG. 1 the first gate region 12 is known as the "top gate" and the second gate region 14 is known as the "bottom gate".

First and second highly doped regions 18 and 20 of n type material, designated "n+" where the "+" indicates increased dopant concentration, are formed either side of the first gate 12. Typically the region 18 can be formed relatively close to the first gate 12. Region 18 acts as the source of the FET. Typically (but not necessarily) region 20 is formed at a greater distance from the first gate 12 and forms the drain of the transistor. In such a device most of the voltage dropped across the device 2 is dropped between the drain region 20 and the first gate 12. A voltage applied between source 18 and the gates 12 and 14 (often the gates 12 and 14 are electrically connected by a very low resistance path such that they can be regarded as being tied together) can be used to cause depletion regions to extend into the channel 16 and to reduce the width of the n type region in the channel available for conduction. A sufficient voltage pinches the channel off, closing it to further conduction.

The region of n type material between the first gate 12 and the drain 20 acts as an extended channel region 22, serves to increase the breakdown voltage of the device 2 but is not actually acting to actively control the current flowing through the device.

FETs can, and routinely are, built as symmetric devices such that the drain 18 can also function as a source, and the source 20 can also function as a drain. In such an arrangement extended channel regions are formed either side of the first gate 12. Alternatively the extended channel regions may be omitted.

In broad terms, it is desirable for the pinch-off voltage of the transistor to be well defined. Having a small separation (height) between the first gate region 12 and the second gate region 14 can leave the pinch-off voltage vulnerable to manufacturing variations during formation of the p type regions—for example due to variation in ion beam intensity across the entire width of a wafer. This means that in prior art devices the pinch-off voltage has been primarily controlled by forming a wider channel (more distance between top and bottom gates) and controlling the doping concentration of the top gate 12, with the top gate 12 being more highly doped than the bottom gate 14, such that it causes the depletion layer boundary in the active channel region 16 to extend further from the surface of the device. This means that a wider channel can be used, making the pinch-off voltage better controlled. The increased doping in the top gate 12 does, however, mean that the depletion regions at the edges (i.e. left hand edge and right hand edge) at the top gate 12 do not move much as the drain or source voltage changes with respect to the gate voltage. Similarly because the drain and source regions, 20 and 18, are highly doped, their depletion region boundaries do not move much with voltage either. As a consequence the distance over which the drain-gate or source-gate voltage acts remains largely unaltered by movement of the depletion regions. This underlines the need to set the distance between the drain diffusion 20 and the top gate 12 properly to set the breakdown voltage.

The existence of a "corner" at the edge of the top gate 12 gives rise to an E-field that can sweep charge carriers (in this example electrons) up from the active channel regions towards the surface of the JFET, and in so doing expose them to a greater distance to travel in the region directly between the drain 20 and the top gate 18. This gives enhanced opportunity for the carriers to interact with the semiconductor lattice in regions of increased E-field, giving rise to an increased rate of electron-hole pair generation and hence an increased gate current.

Figure 2:
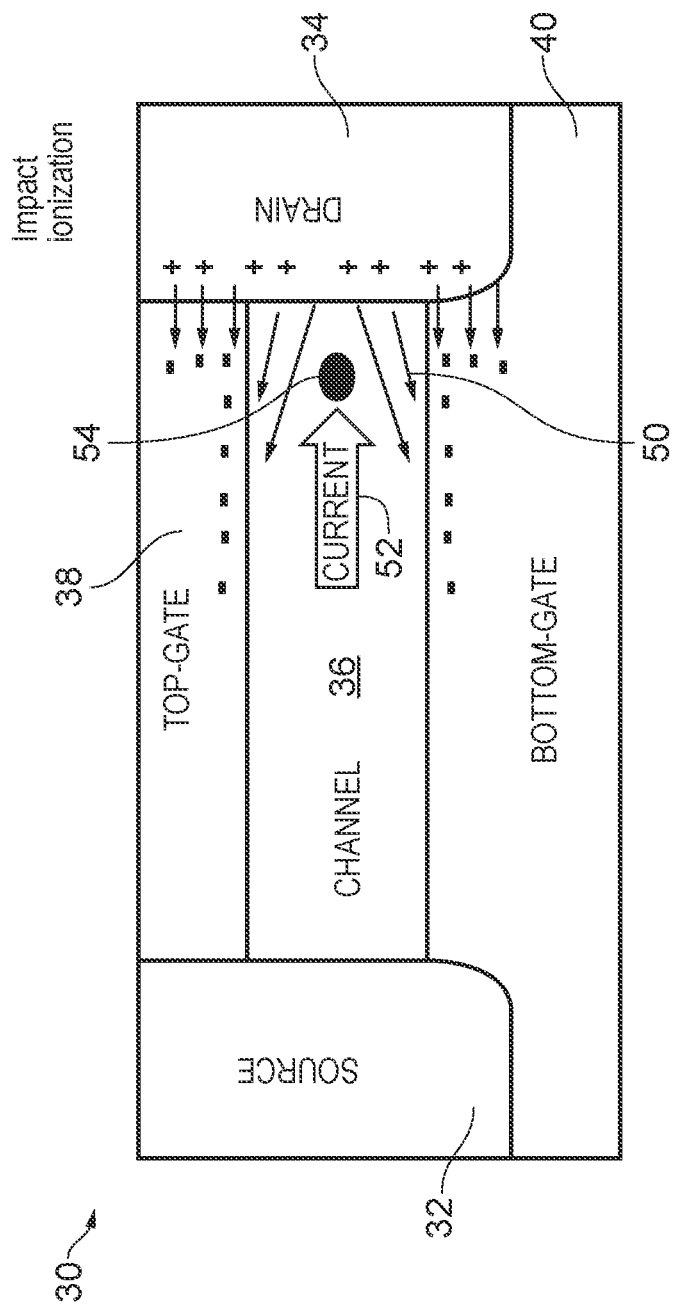
FIG. 2 is a schematic diagram of a known JFET which seeks to provide reduced gate current.

Workers have proposed modified JFET structures. One such device was described in US2011/0084318. FIG. 2 reproduces one of the illustrations from US2011/0084318 but also shows the direction of E fields around the drain region 34. The JFET disclosed in US2011/0084318 has a lightly doped top gate 38 extending the full distance between the source 32 and drain 34 regions. The lightly doped top gate is adapted to be fully depleted throughout operation of the device. The intention is that the depletion region can completely fill the volume of the top gate and extend beyond the edge of the top gate so that no current flows adjacent the top gate. The stated advantage of this design is that it reduces current flow in a high resistance region (shown in FIG. 9 of that publication) and reduces noise in the device (see paragraph 26). The bottom gate 40 is more heavily doped. The source and drain regions 32, 34 extend vertically between the top gate and the bottom gate. The doping concentration of the source and drain are $1\times10^{19}$ to $1\times10^{21}$ atoms per $cm^3$. The channel doping concentration is between $1\times10^{16}$ to $1\times10^{17}$ atoms per $cm^3$. The top gate has a doping concentration of less than $1\times10^{16}$ atoms per $cm^3$. The bottom gate has a doping concentration of $1\times10^{15}$ to $5\times10^{16}$ atoms per $cm^3$. Simulations by the present inventor show that E fields 50 extend from the drain region 34 in the directions of the top and bottom gates. However, mid-way down the channel depth and near the drain 34 is a region 54 where the E field is relatively strong and where the channel current 52 flows (effectively at a depth where vertical E fields from the top and bottom gates cancel one another). The combination of relatively high current density and E field in region 54 gives rise to enhanced risk of impact ionization. This creates minority carriers (holes) which are swept towards the gate regions and travel through the gate regions to the gate contacts, manifesting themselves as an "excess gate current". The term "excess gate current" is used herein to distinguish gate current flow resulting from impact ionization from that of the diode current flow resulting from the reverse biased PN junction formed by the top gate 38 and bottom gate 40 with respect to the channel 36. The current flow in a reverse biased p-n junction can be modelled as $$I = I_S \left( e^{\frac{V_D}{nV_T}} - 1 \right)$$

where
I is the diode current,
$I_S$ is the reverse bias saturation current (or scale current),
$V_D$ is the voltage across the diode,
$V_T$ is the thermal voltage kT/q (Boltzmann constant times temperature divided by electron charge), and
n is the ideality factor, also known as the quality factor or sometimes emission coefficient.

Figure 3:
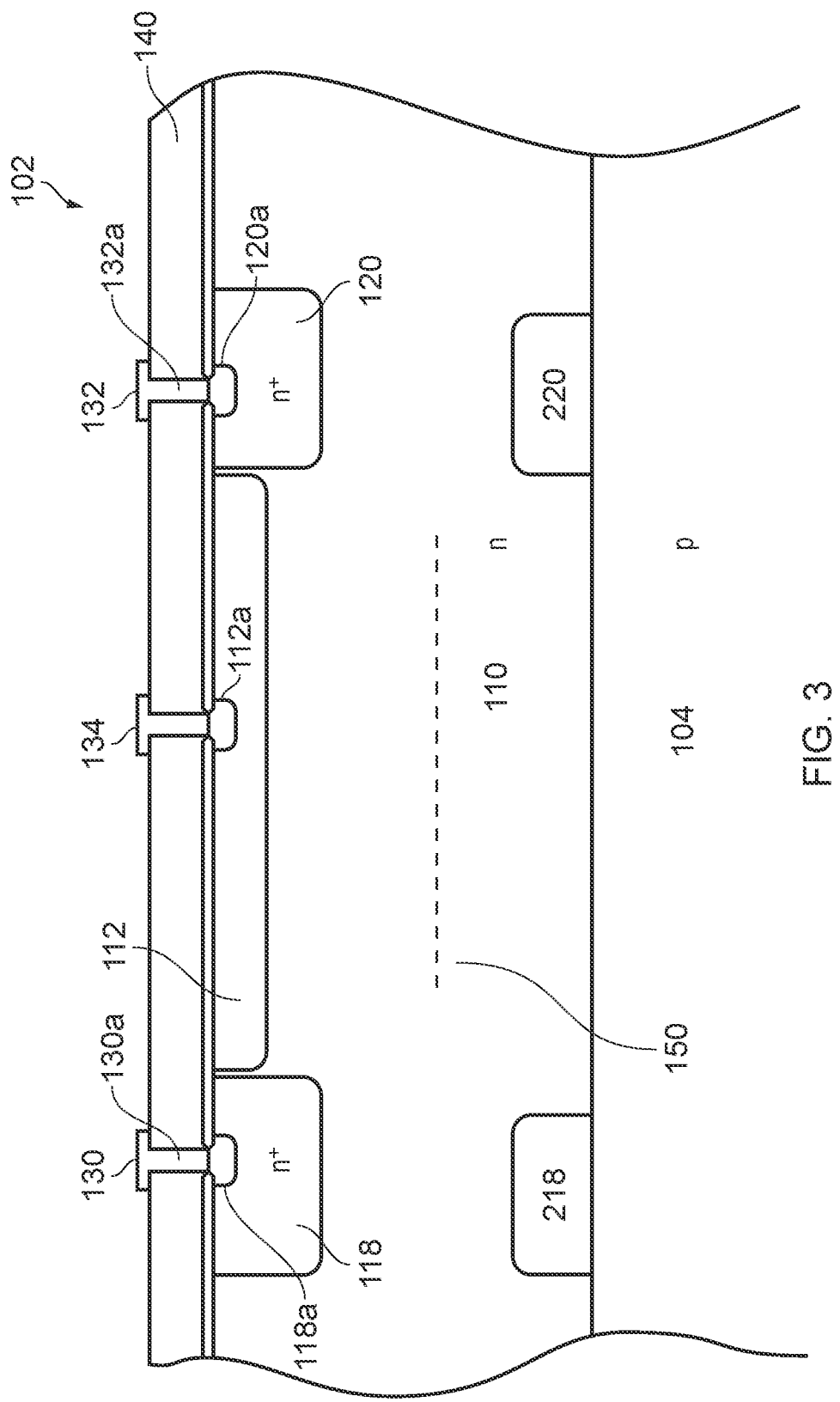
FIG. 3 is a schematic cross section through a JFET constituting an embodiment of the present disclosure.

FIG. 3 schematically shows a cross section through a junction field effect transistor constituting an embodiment of the present invention. Working upwards from the bottom of the device the transistor comprises a bottom gate, generally designated 104, which itself may be formed within a well of semiconductor material doped so as to form a reversed bias junction with respect to the bottom gate 104 or the bottom gate may be fabricated within a well of insulator as known to the person skilled in the art of semiconductor on insulator, SOI, fabrication. A channel region 110 is formed above the bottom gate 104. In this example the bottom gate 104 is formed of p type material and the channel is formed of n type material. The channel doping is typically in the region of $1\times10^{17}$ to $5\times10^{17}$ impurities per $cm^3$. A top gate 112 is formed towards the upper surface of the device. The top gate 112 is, in this embodiment, lightly doped to be p-type. The top gate doping is typically in the region of $1\times10^{16}$ impurities per $cm^3$.

Taking the device as orientated as shown in FIG. 3, an first n type region 118 is formed to one side of the top gate and a second n type region 120 is formed to the other side of the top gate 112. Both regions are more heavily doped than the channel 110, typically in the range of $1\times10^{19}$ impurities per $cm^3$. Each region 118 and 120 may include a further region 118a and 120a of even more highly doped semiconductor in order to gate the low resistance contact with respective metallic conductors 130 and 132 by way of metallic plugs 130a and 132a which in the completed device extend through a layer of dielectric 140 formed over the uppermost surface of the semiconductor forming the device. The first and second N type regions 118 and 120 form the source and drain regions, respectively.

It can be seen that the source and drain regions are substantially contiguous with the top gate region 112. In fact, during manufacture the lightly doped p type top gate 112 can be formed across the surface of the device 102 and then the drain and source regions 120 and 118, respectively, can be highly counter doped with donor impurities. The lightly doped top gate 112 also contains a more heavily doped region 112a to facilitate making the contact to a gate conductor 134.

Figure 3A:
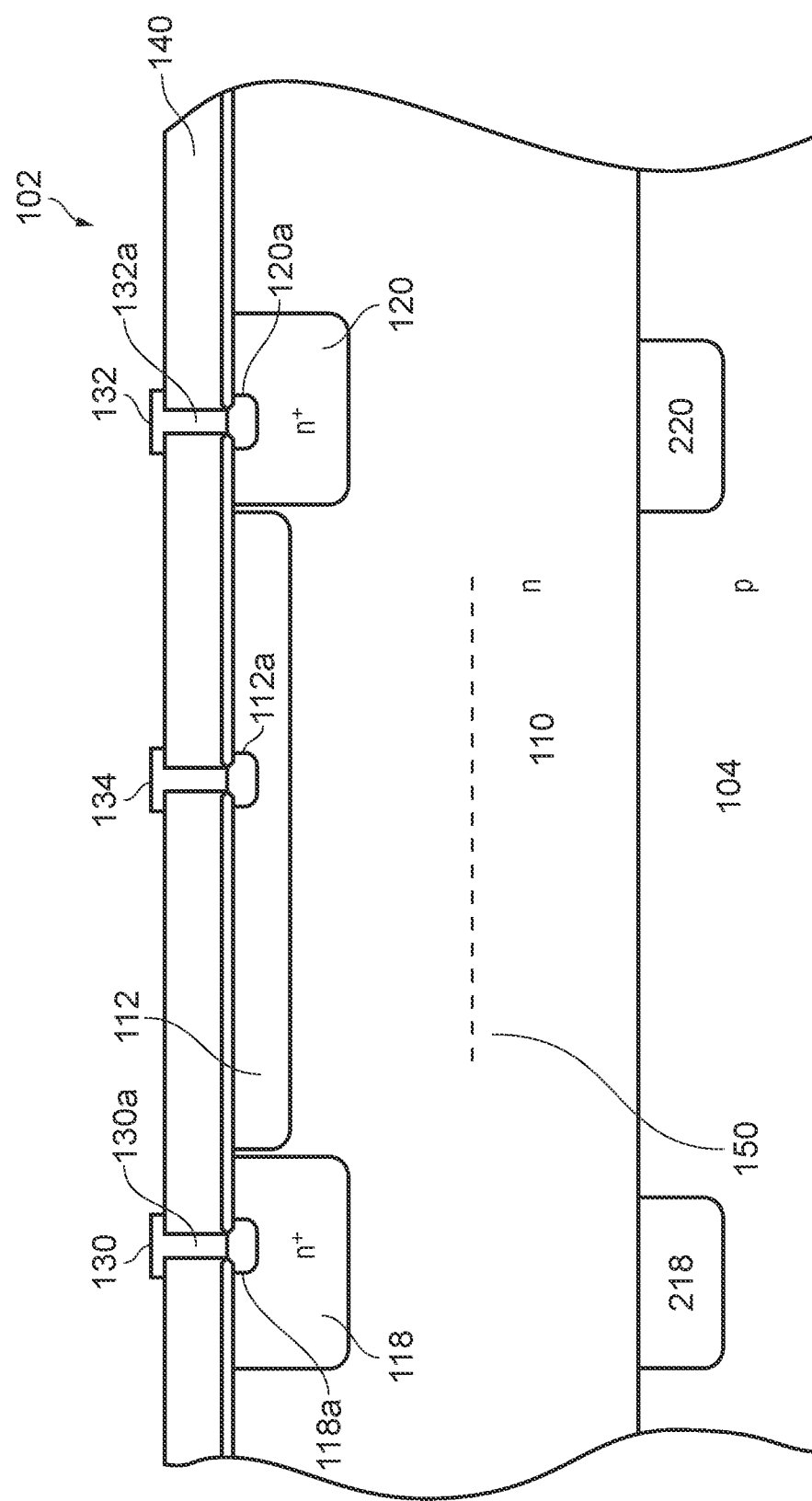
FIG. 3A shows a variation of the arrangement shown in FIG. 3.

It can be seen that the source and drain regions 118 and 120 extend beyond the depth of the lightly doped top gate but, unlike the device shown in FIG. 2, do not extend all the way to the bottom gate 104. Third and fourth n type regions 218 and 220 are formed opposing the first and second doped regions 118 and 120. The regions 218 and 220 may be formed above the bottom gate 104 as shown in FIG. 3, or may be formed within the bottom gate 104 prior to deposition/growth of the n type material forming the channel 110 as shown in FIG. 3A. In some embodiments where the device is asymmetric with the drain being separated from the gate by an extended gate region, only the region 220 opposing the drain doping 120 is formed, or put another way the region 218 may be omitted.

In use, the top and bottom gates 112 and 104, respectively, are held at a negative bias with respect to the source 118 and drain 120. This means that electric field vectors point towards the center of the device between the bottom gate 104 and top gate 112. There is a region, generally indicated by broken line 150 where these E fields substantially cancel. Thus, the negative potential on the top and bottom gates tend to push electrons carrying the charge between the drain and source towards the path denoted by the line 150. The negatively charged electrons tend to repel each other, but the result of the interaction between these competing effects is that the electrons flow in a ribbon centered around the line 150 in the central portion of the channel.

As the electrons start to exit the channel, they "see" the potential created by the drain 120 and start to move upwards towards the drain. As they start to move upwards towards the drain 120 the combination of the drain 120 being formed more deeply than the lightly doped top gate 112, together with the fact that the top gate 112 is lightly doped and hence has become depleted in use, causes the electrons to take a path which does not pass near the corner of the top gate. The n type region 220 beneath the drain 120 also produces an electric field which initially attracts the electrons as they exit the channel region. This also tends to pull the electrons away from the edge of the top gate 112. Thus, at no time do the majority carriers i.e. electrons see the combination of high current density and relatively high electric field strength occurring simultaneously.

Figure 4:
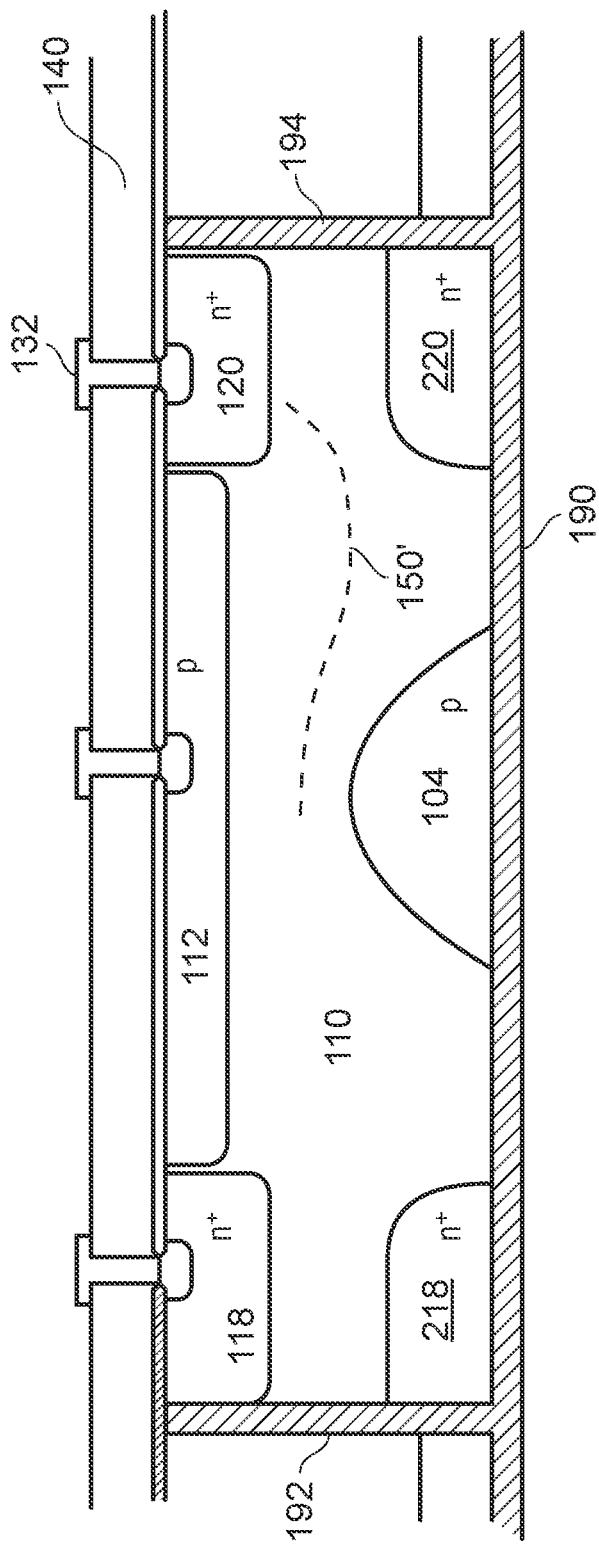
FIG. 4 is a schematic cross section through a second embodiment of a JFET in accordance with the teachings of the present disclosure.

FIG. 4 shows an equivalent structure to that shown in FIG. 3 but implemented using silicon on insulator fabrication techniques. Here, the bottom gate 104 is formed by p type region at the base of the silicon on insulator transistor, 180, which is formed within a space bounded at its bottom by a layer of insulator, such as silicon dioxide 190, by left hand and right hand walls 192 and 194 and similar walls (not shown) passing between walls 192 and 194 above and below the plane of FIG. 4. In this device the bottom gate 104 has been formed as a "hump" such that the channel width is narrowed between the bottom gate and the top gate. This allows the channel depth to be more easily controlled such that the pinch-off voltage can be more easily defined. However, as is the case with FIG. 3 or FIG. 3A, the voltages on the top and bottom gate, which are connected together outside the plane of FIG. 4, interact to form a path 150' where the E field vectors from the bottom gate 104 and the top gate 102 effectively cancel one another. Thus, as is the case with FIG. 3, the current flow is centered around the line 150' such that it stays away from the corner of the top gate 112, where E field intensity would be the greatest due to the sharpness of the radius of curvature at the end of the top gate doping 112. However, by the time the electrons flowing along path 150' start to become aligned with the edge of the top gate 112, they are flowing along a path which is quite remote from the edge of the top gate and also start to see and become attracted to, the drain 120. Consequently, the region of high current density remains separated from the region of high E field adjacent the top gate.

As was also shown in FIG. 3 and FIG. 3A further n type regions 218 and 220 are formed beneath, but separated from, the source 118 and drain 120. In use, the region 218 obtains a potential similar to that to the source 118 by virtue of the n type material of the channel 110 being conductive. Similarly the region 220 obtains a voltage similar to that of the drain 120 for the same reason. Regions 218 and 220 do not need to be connected to the source and drain 118, and 120, for this voltage equalization to occur. As a result, electrons exiting the path 150' see attracting E fields from the drain 120 and the further doping 220 as they approach the drain 120. It is effectively only once the electrons start to become aligned with the drain 120 that they preferentially flow towards it because the drain 120 is more highly doped than region 220, and/or because there is actually a current flow path out of the region 120 by virtue of its connection to the metallic track 132.

Figure 5:
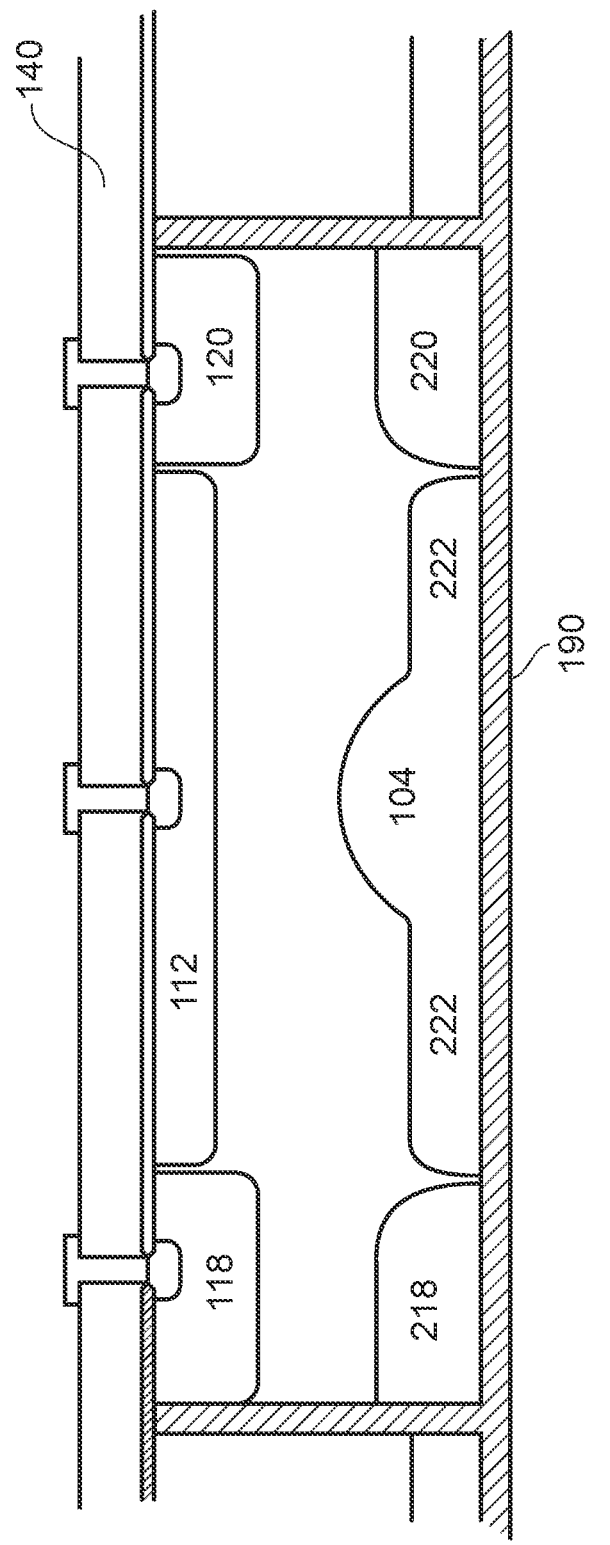
FIG. 5 is a schematic cross section through a JFET constituting a further embodiment of the present disclosure.

FIG. 5 shows a further variation on the arrangement shown in FIG. 4 where the bottom gate 104 has extensions 220 of P type material formed either side of the "humped" section such that the regions 222 approach or abut the n type regions 218 and 220 along the bottom of the device. The additional P type region 222 means that the oxide layer 190 along the base of the junction field effect transistor is completely covered by doped semiconductor and current carriers, in this case electrons, are kept away from interacting with the silicon dioxide 190. This improves the noise performance of the device as current carriers flowing adjacent an insulating layer tend to induce more noise, potentially because of lattice disruption near the edges of the device.

A process flow for forming a low excess gate current JFET will now be discussed. The example relates to an SOI device, but the sequence is equally of use, with minor adjustment, for the formation of JFETs in doped wells.

Figure 6:
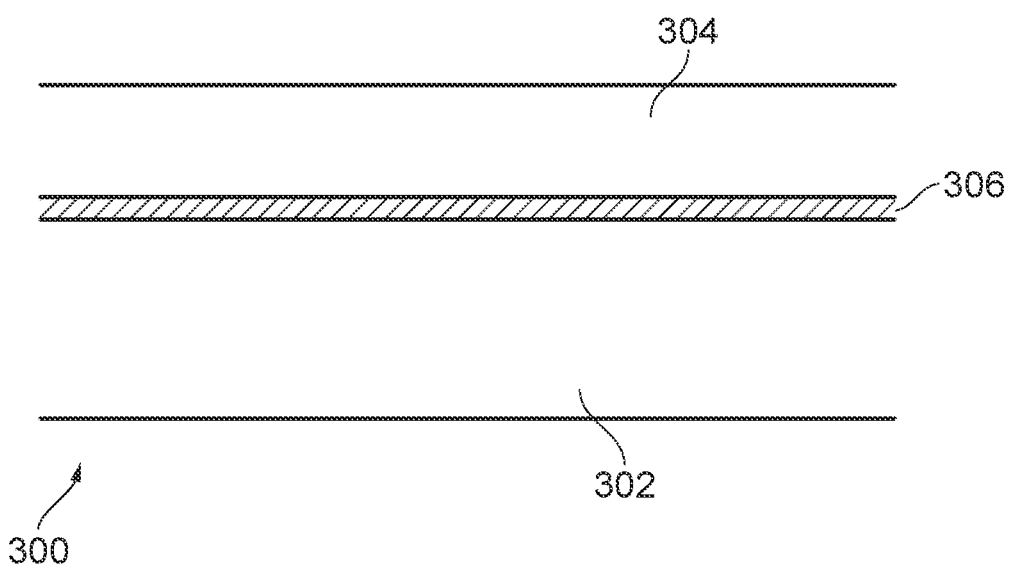
FIG. 6 schematically illustrates a starting wafer for a silicon on insulator (SOI) fabrication of a JFET in accordance with the present disclosure.

FIG. 6 illustrates a starting wafer 300 comprising a bottom layer of semiconductor 302 separated from a top layer 304 by a layer of insulator 306, such as silicon oxide. This type of wafer represents a common starting point for SOI processes and is known to the person skilled in the art. The layer 304 may be lightly p type doped, or may be subjected to an initial doping step to form a layer of p type material.

Figure 7:
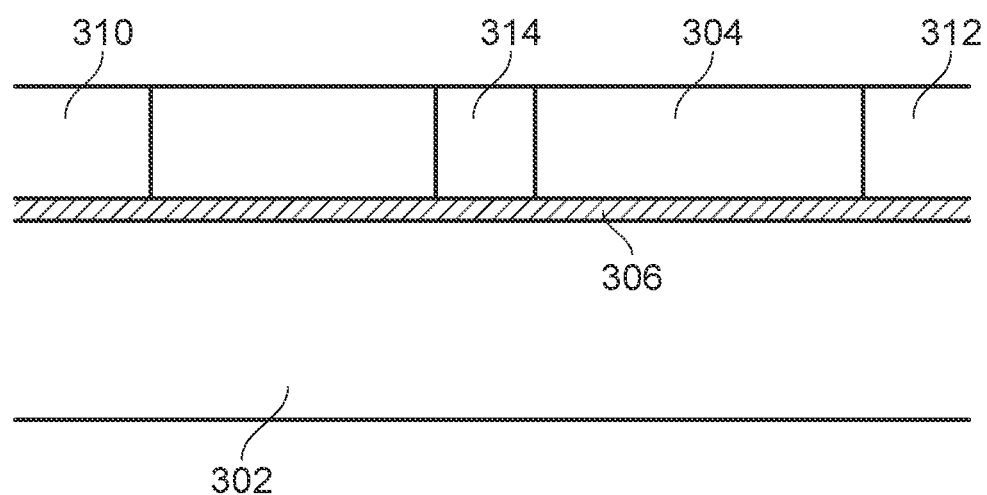
FIG. 7 shows the wafer of FIG. 6 after two patterning and implantation steps have been performed.
Figure 8:
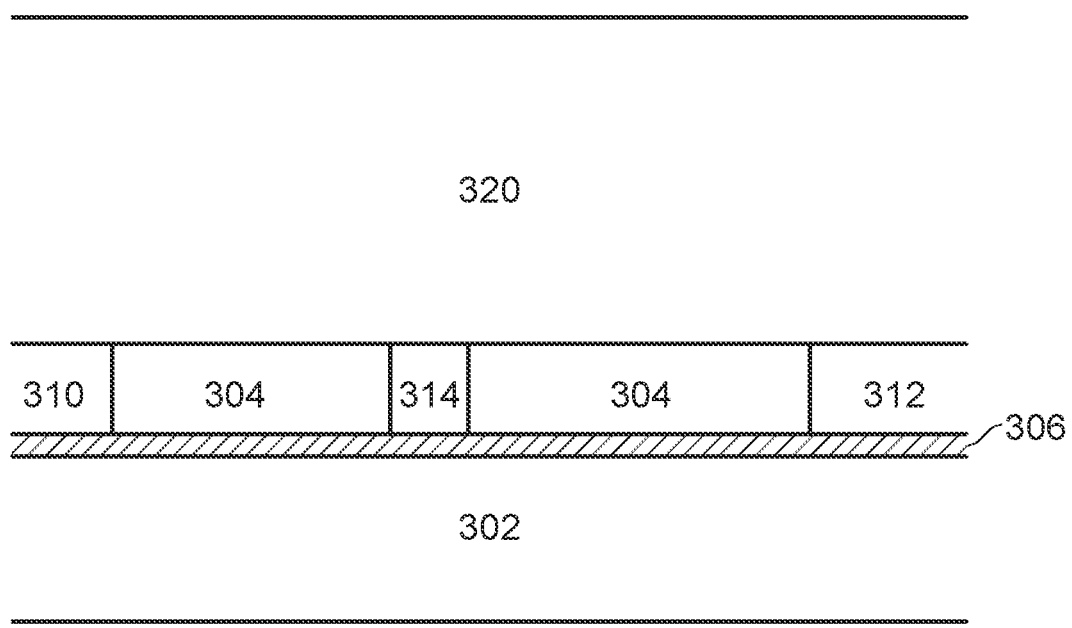
FIG. 8 shows the wafer of FIG. 7 following an epitaxial growth step to form the channel of the JFET.

The wafer 300 is processed by known steps, e.g. patterned and etched and then subjected to ion implantation to form n-type regions 310 and 312 shown in FIG. 7. A subsequent cycle of patterning, etching and implantation is then performed to form a more doped p type region 314. Then a lightly doped n-type epitaxial layer 320 is formed over the upper surface of the wafer to arrive at the structure shown in FIG. 8.

Figure 9:
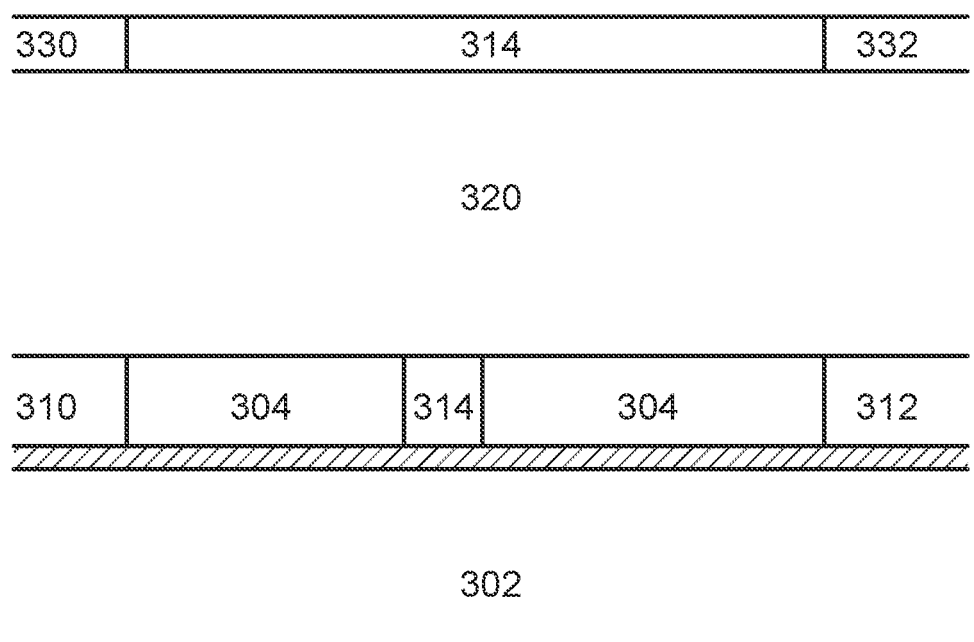
FIG. 9 shows the wafer of FIG. 8 following two further rounds patterning and implantation to form the top gate and then to form the drain and source regions.

Next the surface of the wafer is lightly p type doped before being subjected to a further bout of patterning, etching and implantation to form the highly doped n-type regions 330 and 332 in a lightly doped upper layer 334, as shown in FIG. 9.

The device can then be subjected to further standard processing steps used within SOI manufacture to form isolating trenches around the device which are then filled with dielectric. Overlying passivation layers are also formed and pattered and etched to define contact regions to the metallization layers of the completed device. At one or more appropriate points in the manufacturing process the device will be subjected to a thermal cycle where the wafer is heated to high temperature, often to 700 Celsius or more to cause the implanted regions to diffuse. The diffusion allows region 314 to grow to form the hump 104 in the back gate. It also allows the implanted regions 330 and 332 to diffuse below the depth of the top gate to form the regions 118 and 120 which in a symmetric device can each function as a source and a drain depending on a polarity of an applied voltage. The heating also repairs some of the damage to the semiconductor lattice caused during the ion implantation steps. Following the heating step, the metal layers can be deposited and patterned to connect the various components within each chip.

In testing of a 36V device, no excess gate current was measurable despite gate-drain voltages of 40V being applied.

Figure 10:
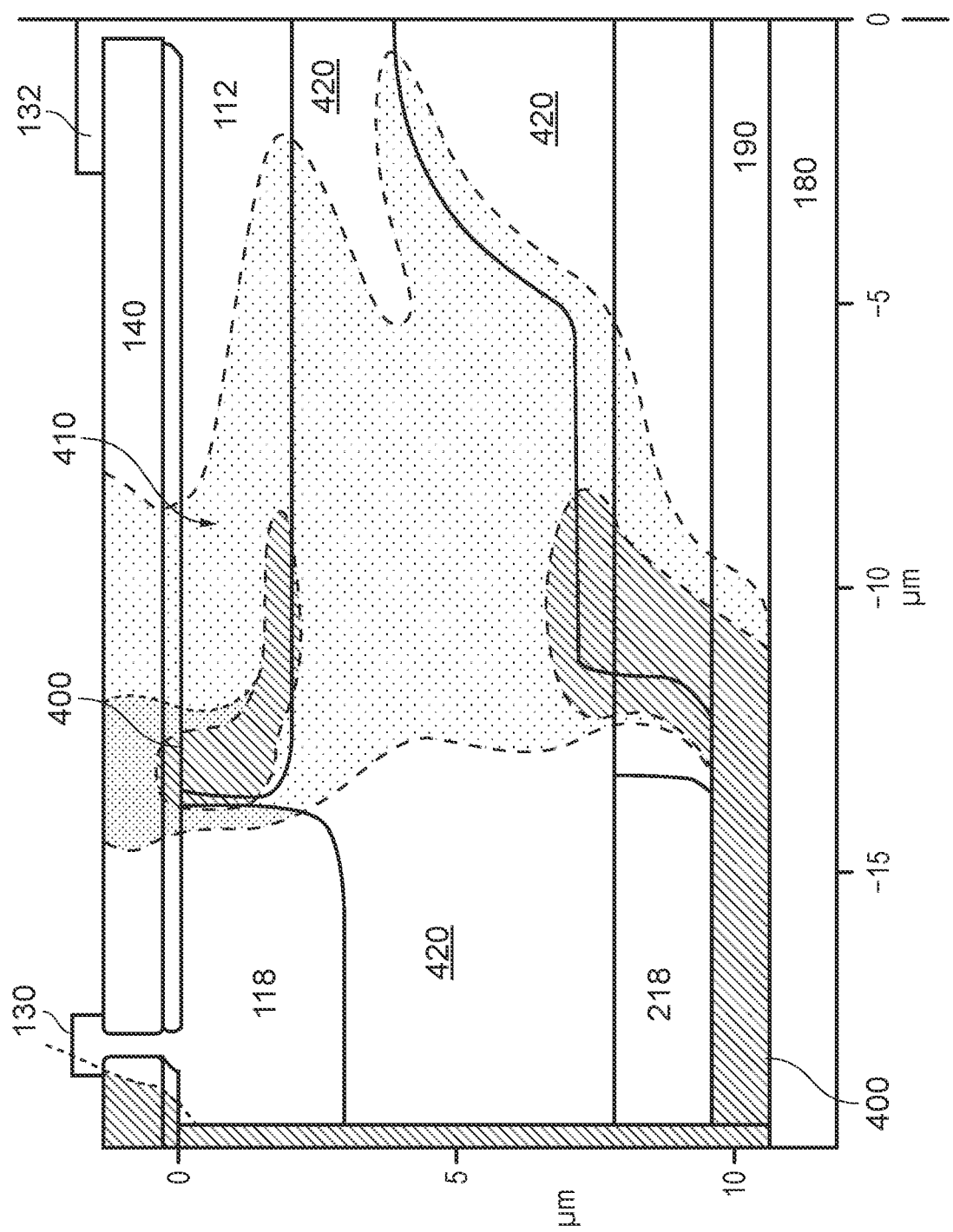
FIG. 10 is a plot showing regions of E field intensity as a function of position around a drain and gate of a JFET constituting an embodiment of this disclosure.

FIG. 10 schematically illustrated E field intensity within a JFET constituting an embodiment of the present disclosure. The regions of relatively high E field strength are shown by the hatched region 400. The hatching at the edge of the device, near the insulating walls, in indicative of a potential difference across the insulating walls. It can be seen that there is a region of relatively high intensity at the edge of the gate near region 118—which in this example is being used as the drain of the symmetric device. A region of intermediate electric field intensity 410 is designated by light shading and unshaded regions 420 have a low electric field intensity. In FIG. 10 the distance along the horizontal axis is measured from the axis of symmetry designated "0" of the transistor.

Figure 11:
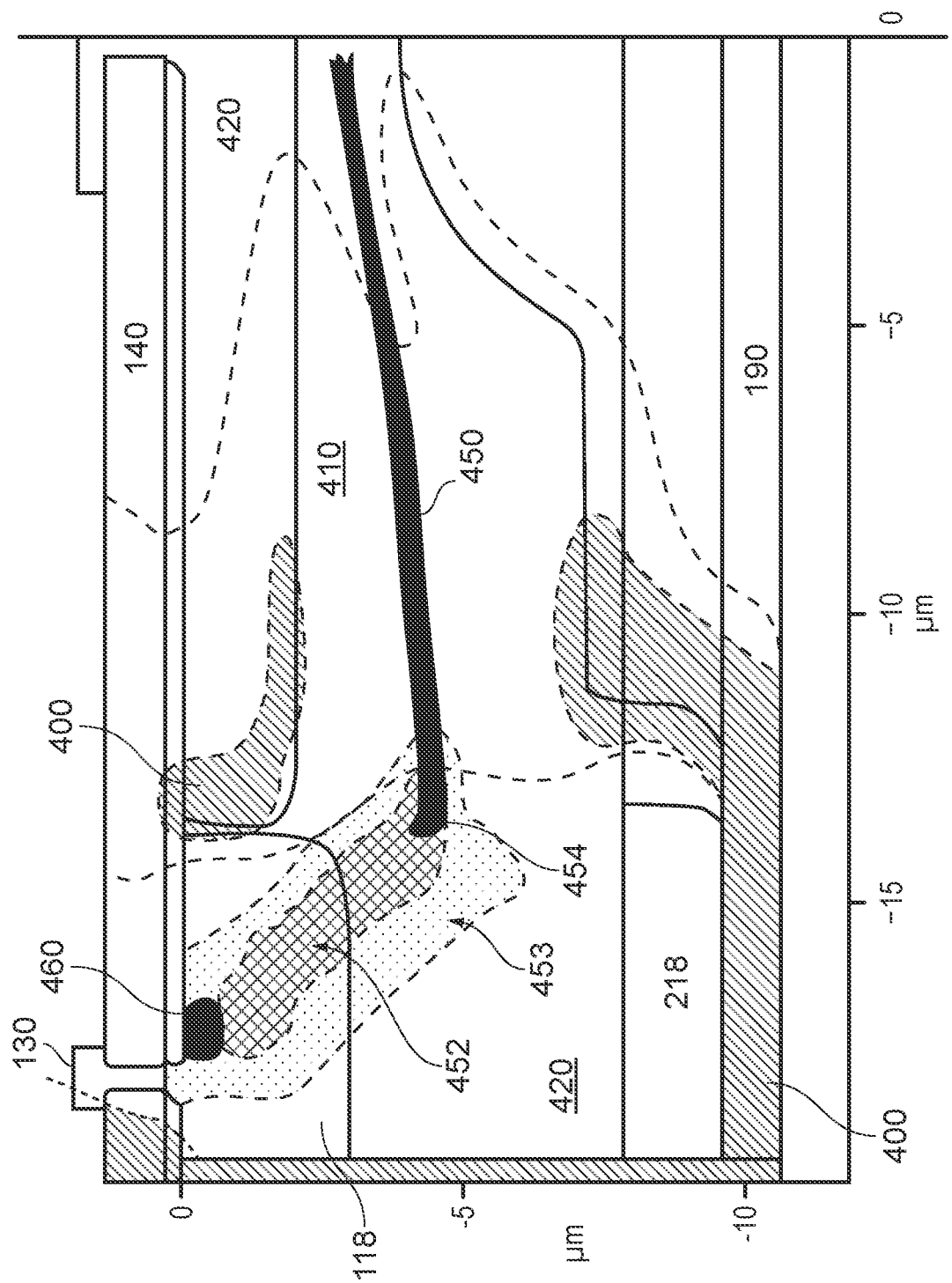
FIG. 11 is a plot of current density as a function of position around the drain and channel of the JFET of FIG. 10.

FIG. 11 shows the calculated flow density of the majority carriers under the same operating conditions. Region 450 is the region of highest density, with the region 452 having the next highest current density of note. Region 453 is a region of low current density. The current density drops significantly as the current fans out from an end 454 of the region 452 and takes various paths to the drain contact, where the current density increases again at region 460. It can be seen that regions of high current density 450 do not coincide with regions 400 of high E field strength. This prevents the formation of conditions that give rise to impact ionization of atoms.

It is thus possible to provide an improved JFET with low gate current, and in fact a gate current that is close to the theoretical minimum JFET gate current for a given size of device, and low noise. In tests the excess gate current was less than 10% of the reverse bias leakage current form the p-n junction forming the gate of the JFET.

Such a JFET can be used in any application in place of conventional JFETs. In general JFETs as described herein are expected to find use in amplifiers or other devices where high input impedance and low noise are desired. Other applications may include voltage controlled resistors, current sources, switches, start up circuits, and logic gates. This list is not exhaustive.

The claims presented herein have been written in single dependency format suitable for filing at the USPTO. However it is to be understood that each claim could depend from or be combined with any preceding claim of the same class (apparatus or method) except where that is clearly technically infeasible.

What is claimed is:

1. A junction field effect transistor (JFET) comprising:
a first doped region acting as a source region; a second doped region acting as a drain region; a bottom gate; a top gate; and a channel extending between the first and second doped regions along a horizontal direction;
wherein the top gate is lightly doped and the first and second doped regions are formed such that they touch the top gate or are spaced apart from the top gate by less than twice a depth of the top gate, and
wherein the first and second doped regions extend into the channel beyond the depth of the top gate, at least a third doped region is formed opposite the second doped region but is separated from the second doped region by the channel along a vertical direction and is doped with a same type of dopant as the second doped region, and the third doped region is coincident or smaller than the second doped region in the horizontal direction, and
wherein the third doped region has a doping concentration higher than that of the channel region such that an entire surface of the second doped region facing the third doped region is separated from the third doped region by a lower net doping concentration-of the channel.

2. A JFET as claimed in claim 1, in which the top gate has a doping concentration similar to or less than that of the bottom gate.

3. A JFET as claimed in claim 1, in which the bottom gate has a varying spatial profile such that a separation between the top gate and the bottom gate varies as a function of position.

4. A JFET as claimed in claim 3, in which the bottom gate has a peripheral portion of substantially uniform depth adjacent a raised portion of the bottom gate.

5. A JFET as claimed in claim 4, in which the third doped region extends above the profile of an adjacent section of the bottom gate.

6. A JFET as claimed in claim 1, in which the bottom gate is furthest from the top gate towards an edge of the top gate where the top gate is adjacent the second doped region.

7. A JFET as claimed in claim 1, further comprising a fourth doped region formed opposite but separated from the first doped region and doped with a same type of impurity as the first doped region.

8. A JFET as claimed in claim 1, in which the third doped region is less heavily doped than the second doped region.

9. A JFET as claimed in claim 1, in which the JFET is a junction insulated device formed within a well of semiconductor.

10. A JFET as claimed in claim 1, in which the JFET is formed within a well which is defined by dielectric materials.

11. A JFET as claimed in claim 1, wherein the first and second doped regions are formed such that they touch the top gate or are spaced apart from the top gate by a region of doped semiconductor.

12. An integrated circuit including at least one JFET as claimed in claim 1.

13. A junction field effect transistor (JFET) comprising:
a first doped region acting as a source region; a second doped region acting as a drain region; a third doped region is formed opposite the second doped region, and a fourth doped region formed opposite and separated from the first doped region, a bottom gate; a top gate; and a channel extending between the first and second doped regions along a horizontal direction;
wherein the top gate is lightly doped and the first and second doped regions are formed such that they touch the top gate or are spaced apart from the top gate by less than twice a depth of the top gate,
wherein the first and second doped regions extend into the channel beyond the depth of the top gate, the third doped region is separated from the second doped region by the channel along a vertical direction, the third doped region is doped with a same type of dopant as the second doped region, and the third doped region is coincident or smaller than the second doped region in the horizontal direction,
wherein the third doped region has a doping concentration higher than that of the channel region, and the channel is between the second doped region and the third doped region for an entire length of the second doped region in the horizontal direction,
wherein the bottom gate has a varying spatial profile such that a separation in the vertical direction between the top gate and the bottom gate varies as a function of position,
wherein the bottom gate is furthest in the vertical direction from the top gate towards an edge of the top gate that is adjacent to the second doped region; and
wherein the fourth doped region is doped with the same type of dopant as the first doped region.

14. A JFET as claimed in claim 13, wherein a base of the JFET comprising an insulator is completely covered by doped semiconductor materials.

15. A JFET as claimed in claim 13, wherein the bottom gate comprises a raised portion and a peripheral portion of substantially uniform depth adjacent to the raised portion, and the peripheral portion and the raised portion are substantially within a footprint of the top gate.

16. A JFET as claimed in claim 15, wherein the varying spatial profile is symmetric about a vertical axis of the JFET, and wherein a separation between the top gate and the raised portion continuously varies as a function of position.

17. A JFET as claimed in claim 13, wherein the bottom gate has a smaller footprint than the top gate.

18. A JFET as claimed in claim 13, wherein an electric field generated by the top gate is substantially canceled by the bottom gate.

* * * * *